United States Patent
Zhang et al.

(10) Patent No.: US 10,296,028 B2
(45) Date of Patent: May 21, 2019

(54) LOW DROPOUT REGULATOR, METHOD FOR IMPROVING STABILITY OF LOW DROPOUT REGULATOR, AND PHASE-LOCKED LOOP

(71) Applicant: HUAWEI TECHNOLOGIES CO., LTD., Shenzhen, Guangdong (CN)

(72) Inventors: Jinhai Zhang, Shenzhen (CN); Fei Cai, Shenzhen (CN); Shenghua Zhou, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/857,037

(22) Filed: Dec. 28, 2017

(65) Prior Publication Data

US 2018/0120882 A1 May 3, 2018

Related U.S. Application Data

(63) Continuation of application No. PCT/CN2016/087707, filed on Jun. 29, 2016.

(30) Foreign Application Priority Data

Jun. 30, 2015 (CN) .......................... 2015 1 0374098

(51) Int. Cl.
G05F 1/575 (2006.01)
G05F 1/56 (2006.01)
H03L 7/08 (2006.01)

(52) U.S. Cl.
CPC ................ G05F 1/575 (2013.01); G05F 1/56 (2013.01); H03L 7/08 (2013.01)

(58) Field of Classification Search
CPC ... G05F 1/10; G05F 1/46; G05F 1/575; G05F 1/56; G05F 1/565; H02M 3/135;
(Continued)

(56) References Cited

U.S. PATENT DOCUMENTS 6,046,577 A 4/2000 Rincon-Mora et al.
7,068,019 B1 6/2006 Chiu
(Continued)

FOREIGN PATENT DOCUMENTS

CN 1667538 9/2005
CN 1677299 10/2005
(Continued)

OTHER PUBLICATIONS

Maxim integrated, *Ultra-Low-Noise LDO Achieves 6nV/√Hz Noise Performance* Application Note 3657, Dec. 22, 2005, pp. 1-3.
(Continued)

*Primary Examiner* — Timothy J. Dole
*Assistant Examiner* — Shahzeb K Ahmad
(74) *Attorney, Agent, or Firm* — Staas & Halsey LLP

(57) ABSTRACT

Embodiments of the present invention disclose a low dropout regulator, a method for improving stability of the low dropout regulator, and a phase-locked loop. The low dropout regulator includes: a reference voltage source, an error amplifier, a regulating circuit, a load, a first compensation circuit, and a second compensation circuit. The first compensation circuit is coupled to the regulating circuit, and is configured to regulate a dominant pole and a secondary dominant pole of the low dropout regulator, to regulate a phase margin. The second compensation circuit is configured to: decrease the dominant pole of the low dropout regulator and further increase the secondary dominant pole on the basis that the first compensation circuit has regulated the dominant pole and the secondary dominant pole of the low dropout regulator, so as to regulate the phase margin; and regulate a gain-bandwidth product of the low dropout regulator.

14 Claims, 4 Drawing Sheets

(58) Field of Classification Search
CPC ......... H02M 3/155; H02M 2001/0003; H02M 2001/007; H02M 2001/0045
See application file for complete search history.

(56) References Cited

U.S. PATENT DOCUMENTS

| | | | |
|---|---|---|---|
| 7,397,226 | B1 | 7/2008 | Mannama et al. |
| 8,169,203 | B1* | 5/2012 | Vemula .................. G05F 1/575 323/273 |
| 8,604,762 | B2 | 12/2013 | Bakkaloglu et al. |
| 8,754,621 | B2* | 6/2014 | El-Nozahi ............... G05F 1/575 323/273 |
| 8,970,188 | B2 | 3/2015 | Ganta |
| 2001/0024140 | A1* | 9/2001 | Taylor ..................... G05F 1/56 330/292 |
| 2002/0005711 | A1 | 1/2002 | Bakker et al. |
| 2005/0040799 | A1* | 2/2005 | Pannwitz ................ G05F 1/575 323/282 |
| 2005/0162141 | A1 | 7/2005 | Kanakubo |
| 2005/0184711 | A1 | 8/2005 | Chen et al. |
| 2005/0242796 | A1 | 11/2005 | Yang et al. |
| 2006/0164053 | A1 | 7/2006 | Walter et al. |
| 2009/0237048 | A1 | 9/2009 | Hou et al. |
| 2014/0159682 | A1 | 6/2014 | Pan et al. |
| 2016/0099645 | A1 | 4/2016 | Fujimura et al. |

FOREIGN PATENT DOCUMENTS

| | | |
|---|---|---|
| CN | 100574065 | 12/2009 |
| CN | 101957627 | 1/2011 |
| CN | 101464699 | 6/2011 |
| CN | 201936213 | 8/2011 |
| CN | 202033682 | 11/2011 |
| CN | 103838290 | 6/2014 |
| CN | 1014950974 | 9/2015 |
| JP | 2005215897 | 8/2005 |
| JP | 20155054 | 1/2015 |

OTHER PUBLICATIONS

Office Action, dated Mar. 3, 2016, in Chinese Application No. 201510374098.1 (8 pp.).
International Search Report, dated Oct. 10, 2016, in International Application No. PCT/CN2016/087707 (5 pp.).
Written Opinion of the International Searching Authority, dated Oct. 10, 2016, in International Application No. PCT/CN2016/087707 (8 pp.).
Search Report, dated Nov. 3, 2016, in Chinese Application No. 10512093 (1 pg.).
Office Action, dated Nov. 7, 2016, in Chinese Application No. 10512093 (5 pp.).
Extended European Search Report, dated May 30, 2018, in European Application No. 16817250.0 (11 pp.).

* cited by examiner

LOW DROPOUT REGULATOR, METHOD FOR IMPROVING STABILITY OF LOW DROPOUT REGULATOR, AND PHASE-LOCKED LOOP

CROSS-REFERENCE TO RELATED APPLICATIONS

This application is a continuation of International Application No. PCT/CN2016/087707, filed on Jun. 29, 2016, which claims priority to Chinese Patent Application No. 201510374098.1, filed on Jun. 30, 2015. The disclosures of the aforementioned applications are hereby incorporated by reference in their entireties.

TECHNICAL FIELD

The present application relates to the semiconductor field, and in particular, to a low dropout regulator, a method for improving stability of the low dropout regulator, and a phase-locked loop.

BACKGROUND

A phase-locked loop (PLL) refers to an automatic control closed-loop system including a phase detector, a loop filter, a voltage control oscillator (VCO), and the like. The PLL can complete phase synchronization between two electrical signals, and therefore is widely applied to fields such as broadcast communication, frequency synthesis, automatic control, and clock synchronization. Stability of the PLL is affected by noise and fluctuation of a power source. Therefore, in actual application, a low dropout regulator (LDO) usually needs to be used to overcome impact of the noise and fluctuation of the power source on the PLL, to ensure a feature of a noise-sensitive circuit such as the PLL.

As shown in FIG. 1, a prior-art LDO may include a reference voltage source 101, an error amplifier 102, a compensation circuit 103, a transistor 104, a bleeder circuit 105, and a load 106. The compensation circuit includes a nulling resistor 1031 and a Miller compensation capacitor 1032, and the bleeder circuit includes a first bleeder resistor 1051 and a second bleeder resistor 1052. Due to existence of the compensation circuit, noise distribution of the prior-art LDO is shown in FIG. 1, where $\overline{V_{n,op}^2}$ represents equivalent input noise of the error amplifier 102, $\overline{V_{n,bg}^2}$ represents output noise of the reference voltage source 101, $\overline{V_{n2,R1}^2}$ represents thermal noise of the resistor 1051, and $\overline{V_{n,R2}^2}$ represents thermal noise of the resistor 1052. It can be learned from the noise distribution of the prior-art LDO that, in the prior-art LDO, noise performance of the LDO can be improved by significantly increasing a transconductance of the error amplifier.

However, a minimum value exists in layout implementation of the nulling resistor, and the minimum value is usually of a magnitude of 10 ohms; and a maximum value of a capacitance also exists in layout implementation of the Miller compensation capacitor. Therefore, a gain-bandwidth product of the error amplifier has a maximum value lower limit. A transconductance upper limit of the error amplifier is relatively low because the gain-bandwidth product of the error amplifier has a maximum value lower limit. Once the transconductance of the error amplifier exceeds the upper limit, system stability of the LDO is compromised.

Therefore, it can be learned that, because the transconductance upper limit of the error amplifier is relatively low, noise performance of the prior-art LDO is relatively poor.

SUMMARY

Embodiments of the present invention provide a low dropout regulator, a method for improving stability of the low dropout regulator, and a phase-locked loop, so as to overcome a problem of poor noise performance of a prior-art low dropout regulator.

According to a first aspect, an embodiment of the present invention provides a low dropout regulator, including: a reference voltage source, configured to provide a reference voltage; an error amplifier, coupled to the reference voltage source, and configured to receive a feedback voltage and the reference voltage, compare the feedback voltage with the reference voltage, and output a control voltage according to a result of comparing the feedback voltage with the reference voltage; a regulating circuit, coupled to the error amplifier, and configured to receive the control voltage, and output a regulating current under control of the control voltage; a load, coupled to the regulating circuit and the error amplifier, where an on-load voltage is formed when the regulating current passes through the load, and the feedback voltage is related to the on-load voltage; a first compensation circuit, coupled to the regulating circuit, and configured to regulate a dominant pole and a secondary dominant pole of the low dropout regulator, so as to regulate a phase margin; and a second compensation circuit, coupled to the first compensation circuit, and configured to: decrease the dominant pole of the low dropout regulator and further increase the secondary dominant pole on the basis that the first compensation circuit has regulated the dominant pole and the secondary dominant pole of the low dropout regulator, so as to regulate the phase margin; and regulate a gain-bandwidth product of the low dropout regulator.

With reference to the first aspect, in a first possible implementation manner of the first aspect, the regulating circuit includes a transistor.

With reference to the first possible implementation manner of the first aspect, in a second possible implementation manner of the first aspect, the first compensation circuit includes a nulling resistor and a Miller compensation capacitor, where a terminal of the Miller compensation capacitor is connected to a drain of the transistor, another terminal of the Miller compensation capacitor is connected to a terminal of the nulling resistor, and another terminal of the nulling resistor is connected to the second compensation circuit.

With reference to the second possible implementation manner of the first aspect, in a third possible implementation manner of the first aspect, the second compensation circuit includes a compensation resistor, where a terminal of the compensation resistor is connected to an output terminal of the error amplifier, and another terminal of the compensation resistor is connected to a terminal of the nulling resistor and a gate of the transistor.

With reference to the third possible implementation manner of the first aspect, in a fourth possible implementation manner of the first aspect, a resistance value of the compensation resistor is not less than a resistance value of an equivalent load resistor of the error amplifier and is less than or equal to $R_{B-MAX}$, where $R_{B-MAX}$ is a resistance value of the compensation resistor when noise reduced by the compensation resistor is equal to noise introduced by the compensation resistor, and the noise reduced by the compensation resistor is noise that is introduced by another component in the low dropout regulator and that is eliminated by the compensation resistor.

With reference to any one of the first aspect or the first to fourth possible implementation manners of the first aspect, in a fifth possible implementation manner of the first aspect, the low dropout regulator further includes a feedback circuit, where the feedback circuit is connected to the error amplifier and the load, and is configured to receive the on-load voltage and generate the feedback voltage according to the on-load voltage.

With reference to any one of the first aspect or the first to fifth possible implementation manners of the first aspect, in a sixth possible implementation manner of the first aspect, the low dropout regulator further includes a noise filter circuit, where the noise filter circuit is coupled to the reference voltage source and the error amplifier, and is configured to perform noise filtering on the reference voltage provided by the reference voltage source, and send, to the error amplifier, the reference voltage on which noise filtering is performed.

According to a second aspect, an embodiment of the present invention further provides a phase-locked loop, where the phase-locked loop includes the low dropout regulator according to any one of the first aspect or the possible implementation manners of the first aspect.

According to a third aspect, an embodiment of the present invention further provides a method for improving stability of a low dropout regulator, including: receiving a reference voltage and a feedback voltage; comparing the feedback voltage with the reference voltage, and generating a control voltage according to a result of comparing the feedback voltage with the reference voltage; generating a regulating current under control of the control voltage; regulating a dominant pole and a secondary dominant pole of the low dropout regulator according to the regulating current; and further regulating the dominant pole and the secondary dominant pole of the low dropout regulator according to the regulating current on the basis that the dominant pole and the secondary dominant pole of the low dropout regulator are regulated according to the regulating current, and regulating a gain-bandwidth product of the low dropout regulator according to the regulating current.

With reference to the third aspect, in a first possible implementation manner of the third aspect, after the receiving a reference voltage and a feedback voltage, the method further includes: performing noise filtering on the reference voltage; and the comparing the feedback voltage with the reference voltage includes: comparing the feedback voltage with the reference voltage on which noise filtering is performed.

The low dropout regulator in the embodiments of the present invention includes: a reference voltage source, configured to provide a reference voltage; an error amplifier, coupled to the reference voltage source, and configured to receive a feedback voltage and the reference voltage, compare the feedback voltage with the reference voltage, and output a control voltage according to a result of comparing the feedback voltage with the reference voltage; a regulating circuit, coupled to the error amplifier, and configured to receive the control voltage, and output a regulating current under control of the control voltage; a load, coupled to the regulating circuit and the error amplifier, where an on-load voltage is formed when the regulating current passes through the load, and the feedback voltage is related to the on-load voltage; a first compensation circuit, coupled to the regulating circuit, and configured to regulate a dominant pole and a secondary dominant pole of the low dropout regulator, so as to regulate a phase margin; and a second compensation circuit, coupled to the first compensation circuit, and configured to: decrease the dominant pole of the low dropout regulator and further increase the secondary dominant pole on the basis that the first compensation circuit has regulated the dominant pole and the secondary dominant pole of the low dropout regulator, so as to regulate the phase margin; and regulate a gain-bandwidth product of the low dropout regulator. Because the second compensation circuit is added, by using the low dropout regulator provided in the embodiments of the present invention, a value of the gain-bandwidth product and a size of the dominant pole can be significantly reduced, and a size of the secondary dominant pole can be increased. Therefore, by introducing the second compensation circuit, system stability of the low dropout regulator can be greatly improved, and a transconductance of the error amplifier in the present invention can be greater than a transconductance of a prior-art error amplifier. Therefore, the error amplifier in the present invention has better noise performance.

BRIEF DESCRIPTION OF DRAWINGS

To describe the technical solutions in the embodiments of the present invention or in the prior art more clearly, the following briefly describes the accompanying drawings required for describing the embodiments or the prior art. Apparently, a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
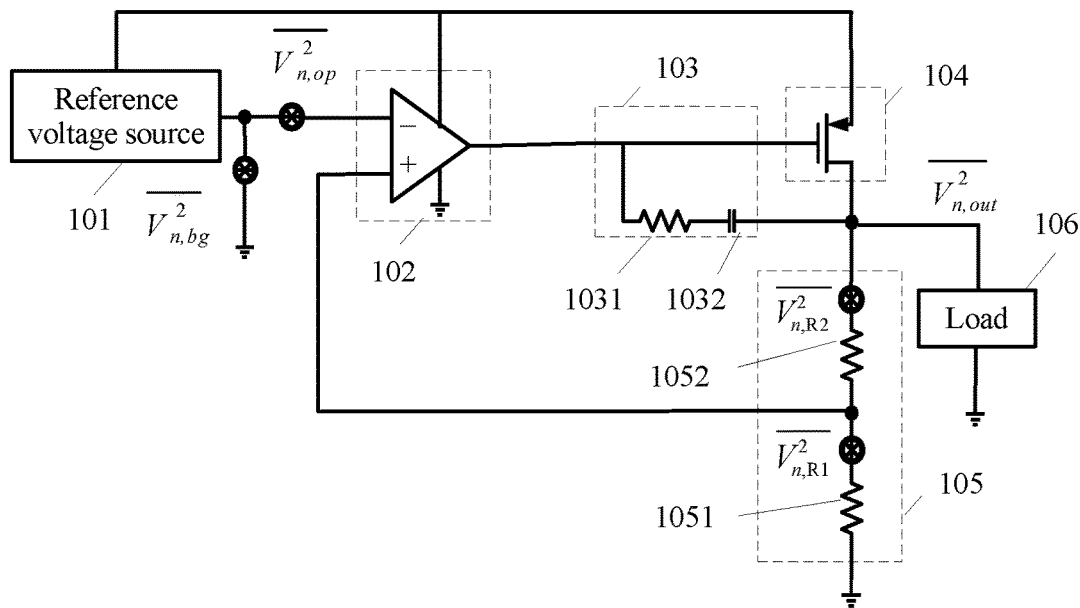
FIG. 1 is a schematic structural diagram of a prior-art LDO.
Figure 2:
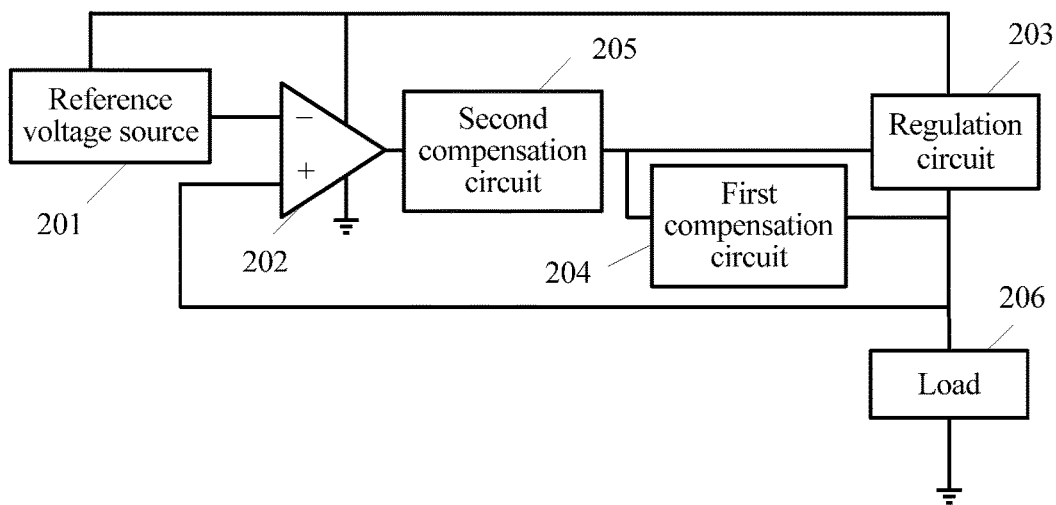
FIG. 2 is a schematic structural diagram of an embodiment of an LDO according to the present invention.

Referring to FIG. 2, FIG. 2 is a schematic structural diagram of an embodiment of an LDO according to the present invention.

As shown in FIG. 2, the LDO according to the present invention may include: a reference voltage source 201, an error amplifier 202, a regulating circuit 203, a first compensation circuit 204, a second compensation circuit 205, and a load 206.

The reference voltage source 201 is configured to provide a reference voltage. The error amplifier 202 is coupled to the reference voltage source 201, and is configured to receive a feedback voltage and the reference voltage, compare the feedback voltage with the reference voltage, and output a control voltage according to a result of comparing the feedback voltage with the reference voltage. The regulating circuit 203 is coupled to the error amplifier 202, and is configured to receive the control voltage, and output a regulating current under control of the control voltage. The load 206 is coupled to the regulating circuit 203 and the error amplifier 202, where an on-load voltage is formed when the regulating current passes through the load 206. The first compensation circuit 204 is coupled to the regulating circuit 203, and is configured to regulate a dominant pole and a secondary dominant pole of the low dropout regulator, so as to regulate a phase margin. The second compensation circuit 205 is coupled to the first compensation circuit 204, and is configured to: further regulate the dominant pole and the secondary dominant pole on the basis that the first compensation circuit 204 has regulated the dominant pole and the secondary dominant pole of the low dropout regulator, so as to regulate the phase margin; and regulate a gain-bandwidth product of the low dropout regulator. The feedback voltage is related to the on-load voltage. This generally means that the feedback voltage and the on-load voltage are in a linear relationship. For example, the feedback voltage is the on-load voltage, or the feedback voltage is in a predetermined proportional relationship with the on-load voltage.

It should be noted herein that, decreasing a dominant pole means that a dominant pole, of the low dropout regulator, obtained through regulation by the first compensation circuit 204 is less than the dominant pole that has not been regulated by the first compensation circuit 204; increasing a secondary dominant pole means that a secondary dominant pole obtained through regulation by the first compensation circuit 204 is greater than the secondary dominant pole that has not been regulated by the first compensation circuit 204; and decreasing a gain-bandwidth product means that a gain-bandwidth product obtained through regulation by the first compensation circuit 204 is less than the gain-bandwidth product that has not been regulated by the first compensation circuit 204.

Figure 3:
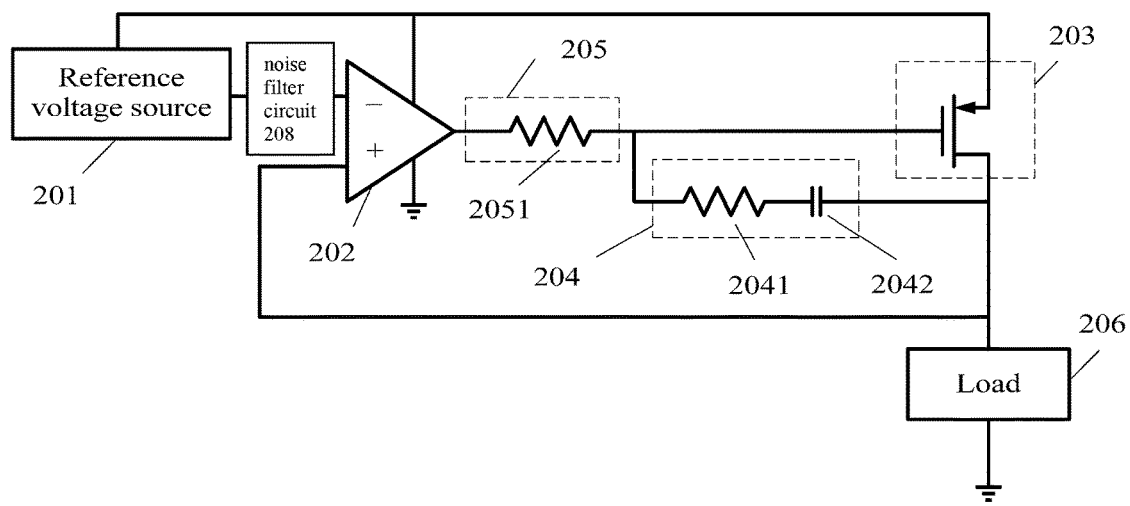
FIG. 3 is a schematic structural diagram of another embodiment of an LDO according to the present invention.

In specific implementation, a circuit structure of the LDO may be shown in FIG. 3.

A negative input of the error amplifier 202 is connected to the reference voltage source 201 and is configured to receive the reference voltage from the reference voltage source. A positive input of the error amplifier 202 is coupled to the load, and is configured to receive the feedback voltage.

The first compensation circuit 204 may be a Miller capacitor-nulling resistor compensation circuit. That is, the first compensation circuit 204 may include a nulling resistor 2041 and a Miller compensation capacitor 2042. The Miller compensation capacitor 2042 is connected to a drain of the transistor 203, and is further connected to a terminal of the nulling resistor 2041. Another terminal of the nulling resistor 2041 is connected to the second compensation circuit 205.

The regulating circuit 203 may be a power MOS device such as a transistor. The second compensation circuit 205 may include a compensation resistor 2051. A terminal of the compensation resistor 2051 is connected to an output terminal of the error amplifier 202, and another terminal of the compensation resistor 2051 is connected to a terminal of the nulling resistor 2041 and a gate of the regulating circuit 203.

The compensation resistor 2051 may be a silicon diffusion resistor, a MOS device resistor, or a metal wiring resistor.

It can be obtained, according to load distribution of the LDO in the present invention by formulating and solving node current and voltage equations, that three poles of the LDO are:

$$p_1 \cong \frac{-1}{g_{m2}R_{LOAD}C_c(R_1+R_B)};$$

$$p_2 \cong \frac{-g_{m2}C_C(1+R_B/R_1)}{C_1C_2+C_CC_1+C_CC_2+g_{m2}R_BC_CC_1} \cong \frac{-g_{m2}(1+R_B/R_1)}{C_2+g_{m2}R_BC_1}; \text{ and}$$

$$p_3 \cong \frac{-(1+g_{m2}R_BC_{o1}/C_{o2})}{R_{nl}C_{o1}};$$

a zero point of the LDO is:

$$z_1 = \frac{1}{C_C(1/g_{m2}-R_{nl})};$$

and a GBW of the LDO may be represented as:

$$GBW = \frac{g_{m1}}{C_C}\frac{R_1}{(R_1+R_B)},$$

where $C_C$ is c a capacitance value of the Miller compensation capacitor 2042, $R_{nl}$ is a resistance value of the nulling resistor 2041, $g_{m2}$ is a transconductance of the regulating circuit 203, $g_{m1}$ is a transconductance of the error amplifier 202, $R_{LOAD}$ is a load resistance value of the load, $C_{LOAD}$ is a load capacitance value of the load 206, $R_1$ is a resistance value of an equivalent load resistor of the error amplifier 202, $C_1$ is a capacitance value of an equivalent load capacitor of the error amplifier 202, and $R_B$ is a resistance value of the compensation resistor 2051.

It can be learned that, because the pole p2 is canceled by the zero point, the dominant pole of the LDO in the present invention is p1, and the secondary dominant pole is p3. In the LDO provided in this embodiment of the present invention, by adding the second compensation circuit, the gain-bandwidth product GBW and the dominant pole p1 can be significantly reduced, and the secondary dominant pole p3 can be increased. Therefore, by introducing the second compensation circuit, system stability is greatly improved, and a transconductance of the error amplifier in the present invention can be greater than a transconductance of a prior-art error amplifier. Therefore, the error amplifier in the present invention has better noise performance. In addition, introduction of the second compensation circuit not only can reduce an area of the LDO by reducing a value of $C_C$, but also can increase a phase margin of the LDO by reducing the GBW of the LDO, thereby improving a load driving capability of the LDO.

Further, because a resistor also introduces noise, when the second compensation circuit is a compensation resistor, a formula of noise introduced by the compensation resistor may be represented as:

$$\overline{V_{n,out}^2} = \int_{f_1}^{f_2}\left(\overline{V_{n,ea}^2}+\left(\left|\frac{1}{sRC+1}\right|\right)^2\overline{V_{n,ref}^2}+\overline{V_{n,PFET}^2}\frac{1}{A_V^2}+4kTR_B\frac{1}{A_V^2}\right)df,$$

where $V_{n,out}$ refers to output noise of the LDO, $V_{n,ea}$ refers to noise introduced by the error amplifier 202, sRC refers to a time constant of a noise filter, $V_{n,ref}$ refers to noise introduced by the reference voltage source 201, $V_{n,PFET}$ refers to noise introduced by the transistor 203, $A_V$ refers to a gain of the error amplifier 202, k refers to a Boltzmann constant, and T refers to a temperature.

Although noise introduced by another component of the LDO can be more reduced as the resistance value of the compensation resistor increases, it can be learned from the foregoing formulas that the noise introduced by the compensation resistor also increases as the resistance value of the compensation resistor increases, and when the resistance value of the compensation resistor exceeds a specific value, the noise introduced by the resistor may exceed noise reduced by the compensation resistor. The noise reduced by the compensation resistor refers to the noise that is introduced by the another component in the low dropout regulator and that is eliminated by the compensation resistor.

To prevent the compensation resistor from introducing too large noise, in actual usage, a value of $R_B$ needs to be less than $R_{B-MAX}$, and $R_{B-MAX}$ refers to a resistance value of the compensation resistor 2051 when the noise reduced by the compensation resistor 2051 is equal to the noise introduced by the compensation resistor 2051. $R_{B-MAX}$ may be calculated according to the noise introduced by the error amplifier 202, the noise introduced by the reference voltage source 201, the noise introduced by the transistor 203, and the gain of the error amplifier 202.

It can be learned from the formulas for calculating the poles that when $R_B \geq R_1$, the GBW and $p_1$ start to change significantly. Therefore, usually, it may be set that $R_B \geq R_1$. Therefore, a value range of $R_B$ may be $R_1 \leq R_B \leq R_{B-MAX}$. When the value of $R_B$ falls within this range, noise of the LDO can be effectively reduced.

Figure 4:
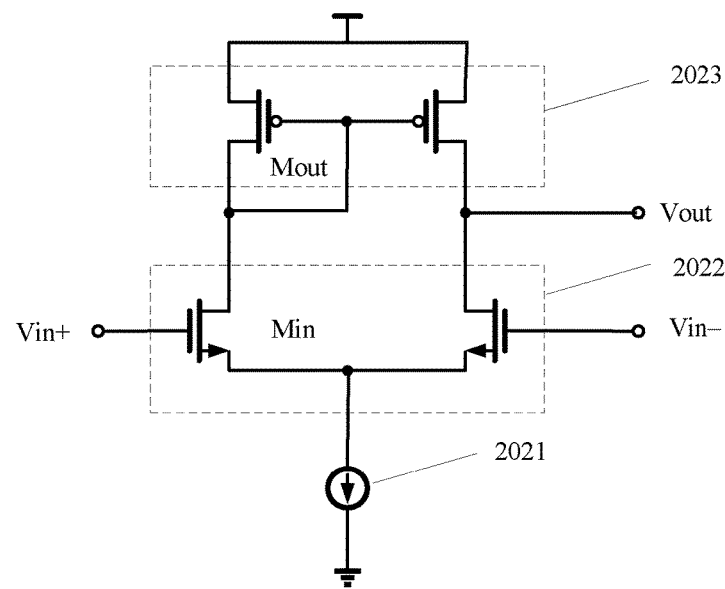
FIG. 4 is a schematic structural diagram of an embodiment of an error amplifier in an LDO according to the present invention.

To further improve noise performance of the LDO, as shown in FIG. 4, the error amplifier 202 may include a bias current source 2021, an input tube 2022, and an output current mirror 2023. The input tube 2022 is coupled between the bias current source 2021 and the output current mirror 2023.

Equivalent input noise of the error amplifier 202 may be represented as:

$$\overline{V_{op}^2} \approx 2\left(4kT\gamma\left[\frac{g_{m,out}}{g_{m,in}^2} + \frac{1}{g_{m,in}}\right] + \frac{1}{C_{ox}}\left[\frac{K_{out}g_{m,out}^2}{(WL)_{out}g_{m,in}^2} + \frac{K_{in}}{(WL)_{in}}\right]\frac{1}{f}\right),$$

where $g_{m,in}$ is a transconductance of the input tube 2022, $g_{m,out}$ is a transconductance of the output current mirror 2023, $(WL)_{in}$ is a product of a width and a length of the input tube 2022, $(WL)_{out}$ is a product of a width and a length of the output current mirror 2023, $K_{in}$ is a carrier mobility of the input tube 2022, $K_{out}$ is a carrier mobility of the output current mirror 2023, $C_{ox}$ is a unit capacitance of gate oxide of a MOS device, k is a Boltzmann constant, T is a Kelvin temperature, and $\gamma$ is a channel coefficient of the device.

To further improve noise performance of the LDO, a noise filter circuit 208 may be further disposed between the reference voltage source 201 and the error amplifier 202. The noise filter circuit 208 may be coupled to the reference voltage source 201 and the error amplifier 202, and is configured to perform noise filtering on the reference voltage provided by the reference voltage source 201, and send, to the error amplifier 202, the reference voltage on which noise filtering is performed.

In addition, in this embodiment of the present invention, an output voltage of the low dropout regulator may be directly used as a feedback voltage of the error amplifier 202. In order that the output voltage of the LDO can be regulated, in another embodiment of the present invention, a feedback circuit 207 may be configured to generate a feedback voltage according to the on-load voltage.

Figure 5:
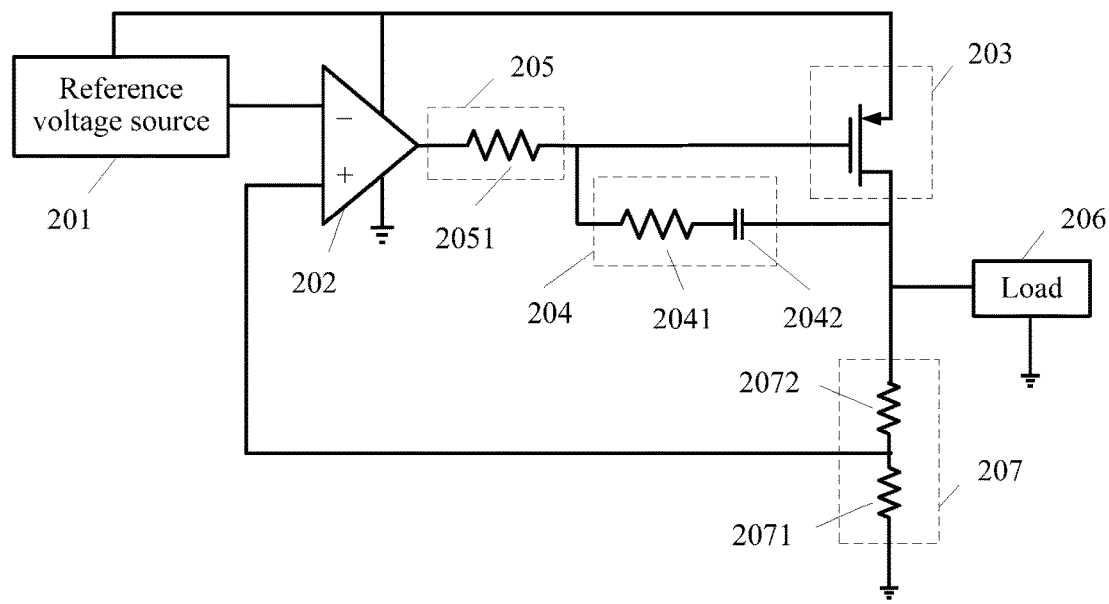
FIG. 5 is a schematic structural diagram of another embodiment of an LDO according to the present invention.

As shown in FIG. 5, the feedback circuit 207 may include a first bleeder resistor 2071 and a second bleeder resistor 2072. A terminal of the first bleeder resistor 2071 is connected to the positive input of the error amplifier 202, and another terminal of the first bleeder resistor 2071 is connected to a battery ground. A terminal of the second bleeder resistor 2072 is connected to the positive input of the error amplifier 202, and another terminal of the second bleeder resistor 2072 is connected to the drain of the transistor 203 and the load. Therefore, a magnitude of the feedback voltage can be changed by regulating a resistance value of the first bleeder resistor and a resistance value of the second bleeder resistor 2072, so as to change a magnitude of the on-load voltage of the LDO.

It can be learned from the foregoing embodiment that, by adding a second compensation circuit, a value of a gain-bandwidth product and a size of a dominant pole can be significantly reduced, and a size of a secondary dominant pole can be increased. Therefore, by introducing the second compensation circuit, system stability is greatly improved, and a transconductance of an error amplifier in the present invention can be greater than a transconductance of a prior-art error amplifier. Therefore, the error amplifier in the present invention has better noise performance.

Corresponding to the LDO embodiment in the present invention, an embodiment of the present invention further provides a method for improving stability of a low dropout regulator.

Figure 6:
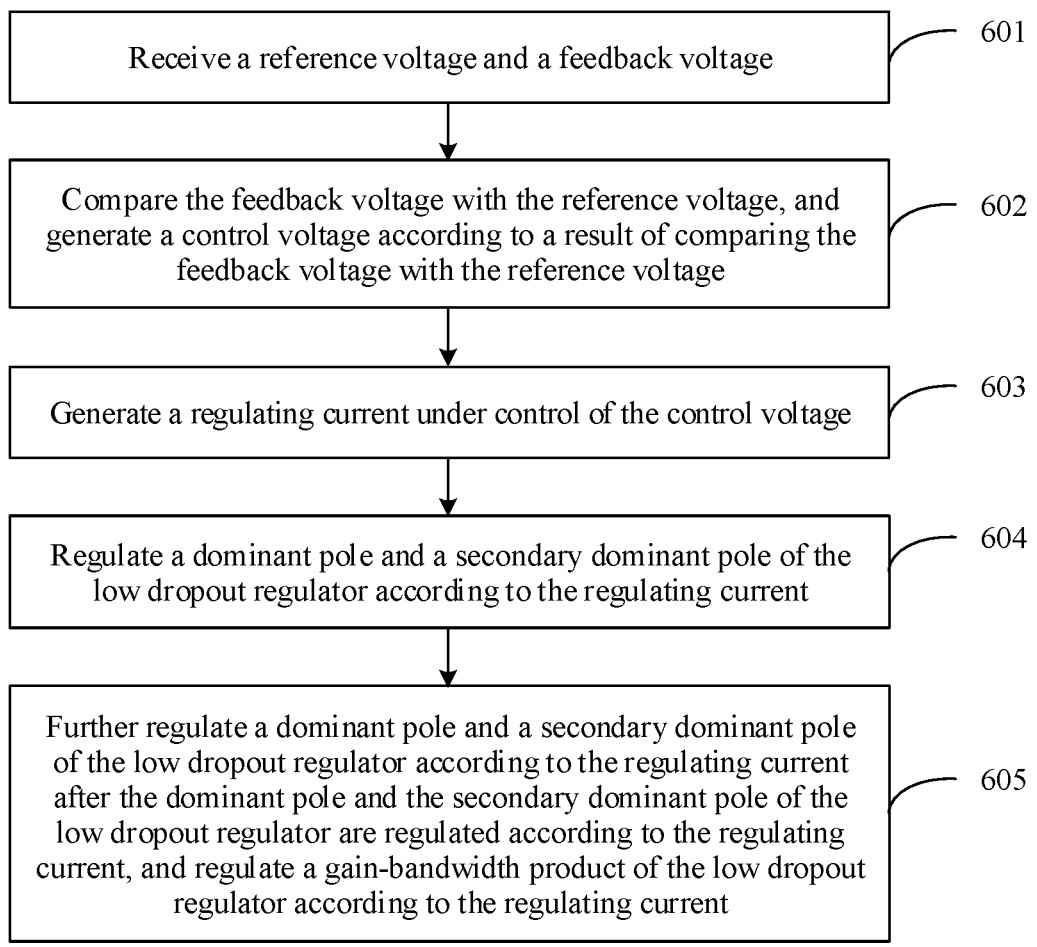
FIG. 6 is a schematic flowchart of an embodiment of a method for improving stability of a low dropout regulator according to the present invention.

As shown in FIG. 6, the method for improving stability of a low dropout regulator includes the following steps.

Step 601: Receive a reference voltage and a feedback voltage.

An LDO noise regulation apparatus first receives the reference voltage and the feedback voltage. The reference voltage is provided by a reference voltage source, and the feedback voltage is related to an on-load voltage of the LDO.

Step 602: Compare the feedback voltage with the reference voltage, and generate a control voltage according to a result of comparing the feedback voltage with the reference voltage.

After receiving the feedback voltage and the reference voltage, the LDO noise regulation apparatus may compare the feedback voltage with the reference voltage, and generate the control voltage according to the result of comparing the feedback voltage and the reference voltage. The reference voltage may be a voltage directly output by the reference voltage source, or may be a voltage obtained after a voltage directly output by the reference voltage source is filtered by a noise filter circuit. The feedback voltage may be the on-load voltage of the LDO, or may be a voltage generated by a feedback circuit according to the on-load voltage of the LDO. For a specific manner of generating the reference voltage, reference may be made to the foregoing descriptions, and details are not described herein.

Step 603: Generate a regulating current under control of the control voltage.

After the control voltage is generated, the LDO noise regulation apparatus may generate the regulating current according to the control voltage. The LDO noise regulation apparatus may generate the regulating current by using a regulating circuit. The regulating circuit may be a power MOS device such as a transistor. For a specific manner of generating the regulating current, reference may be made to the foregoing descriptions, and details are not described herein.

Step 604: regulate a dominant pole and a secondary dominant pole of the low dropout regulator according to the regulating current.

After the regulating current is generated, the LDO noise regulation apparatus may regulate the dominant pole and the secondary dominant pole of the low dropout regulator by using a circuit structure or a signal processing process that has an effect of zero-pole splitting, for example, a compensation circuit including a nulling resistor and a Miller compensation capacitor. In this way, a regulated dominant pole is less than the dominant pole before the regulation, and a regulated secondary dominant pole is greater than the secondary dominant pole before the regulation. For a specific implementation manner, reference may be made to the foregoing embodiments, and details are not described herein.

Step 605: Further regulate the dominant pole and the secondary dominant pole of the low dropout regulator according to the regulating current on the basis that the dominant pole and the secondary dominant pole of the low dropout regulator are regulated according to the regulating current, and regulate a gain-bandwidth product of the low dropout regulator according to the regulating current.

Another compensation circuit may be further used to regulate the dominant pole and the secondary dominant pole of the low dropout regulator according to the regulating current on the basis that the LDO noise regulation apparatus regulates the dominant pole and the secondary dominant pole of the low dropout regulator by using the circuit structure or the signal processing process that has the effect of zero-pole splitting; and regulate the gain-bandwidth product of the low dropout regulator according to the regulating current. The dominant pole and the secondary dominant pole of the low dropout regulator may be further regulated in a resistor compensation manner. For a specific implementation manner, reference may be made to the foregoing embodiments, and details are not described herein.

It can be learned that, by regulating a dominant pole and a secondary dominant pole of a low dropout regulator in a two-level regulation manner, a value of a gain-bandwidth product and a size of the dominant pole can be significantly reduced, and a size of the secondary dominant pole can be increased. Therefore, by introducing a second compensation circuit, system stability is greatly improved, and a transconductance of an error amplifier in the present invention can be greater than a transconductance of a prior-art error amplifier. Therefore, the error amplifier in the present invention has better noise performance.

In addition to the LDO in the foregoing embodiments, the embodiments of the present invention further provide a phase-locked loop, where an LDO in the phase-locked loop may be the LDO described in the foregoing embodiments.

A person skilled in the art may clearly understand that, the technologies in the embodiments of the present invention may be implemented by software in addition to a necessary general hardware platform. Based on such understanding, the technical solutions of the present invention essentially or the part contributing to the prior art may be implemented in a form of a software product. The software product is stored in a storage medium, such as a ROM/RAM, a hard disk, or an optical disc, and includes several instructions for instructing a computer device (which may be a personal computer, a server, or a network device) to perform the methods described in the embodiments or some parts of the embodiments of the present invention.

The embodiments in this specification are all described in a progressive manner, for same or similar parts in the embodiments, reference may be made to these embodiments, and each embodiment focuses on a difference from other embodiments. Especially, a system embodiment is basically similar to a method embodiment, and therefore is described briefly; for related parts, reference may be made to partial descriptions in the method embodiment.

The foregoing descriptions are implementation manners of the present invention, but are not intended to limit the protection scope of the present invention. Any modification, equivalent replacement, and improvement made without departing from the spirit and principle of the present invention shall fall within the protection scope of the present invention.

What is claimed is:

1. A low dropout regulator, comprising:
a reference voltage source, configured to provide a reference voltage;
an error amplifier, coupled to the reference voltage source, and configured to receive a feedback voltage and the reference voltage, compare the feedback voltage with the reference voltage, and output a control voltage according to a result of comparing the feedback voltage with the reference voltage;
a regulating circuit, coupled to the error amplifier, and configured to receive the control voltage, and output a regulating current under control of the control voltage;
a load, coupled to the regulating circuit and the error amplifier, wherein an on-load voltage is formed when the regulating current passes through the load, and the feedback voltage is related to the on-load voltage;
a first compensation circuit, coupled to the regulating circuit, and configured to regulate a dominant pole and a secondary dominant pole of the low dropout regulator, so as to regulate a phase margin; and
a second compensation circuit, coupled to the first compensation circuit, and configured to: decrease the dominant pole of the low dropout regulator and further increase the secondary dominant pole on the basis that the first compensation circuit has regulated the dominant pole and the secondary dominant pole of the low dropout regulator, so as to regulate the phase margin; and regulate a gain-bandwidth product of the low dropout regulator, wherein:
the second compensation circuit comprises a compensation resistor, wherein a terminal of the compensation resistor is connected to an output terminal of the error amplifier, and another terminal of the compensation resistor is connected to a terminal of a nulling resistor and a gate of the transistor.

2. The low dropout regulator according to claim 1, wherein the regulating circuit comprises a transistor.

3. The low dropout regulator according to claim 2, wherein:
the first compensation circuit comprises the nulling resistor and a Miller compensation capacitor, wherein a terminal of the Miller compensation capacitor is connected to a drain of the transistor, another terminal of the Miller compensation capacitor is connected to a terminal of the nulling resistor, and another terminal of the nulling resistor is connected to the second compensation circuit.

4. The low dropout regulator according to claim 1, wherein a resistance value of the compensation resistor is not less than a resistance value of an equivalent load resistor of the error amplifier and is less than or equal to $R_{B\text{-}MAX}$, wherein $R_{B\text{-}MAX}$ is a resistance value of the compensation resistor when noise reduced by the compensation resistor is equal to noise introduced by the compensation resistor, and the noise reduced by the compensation resistor is noise that is introduced by another component in the low dropout regulator and that is eliminated by the compensation resistor.

5. The low dropout regulator according to claim 1, further comprising a feedback circuit, wherein
the feedback circuit is connected to the error amplifier and the load, and is configured to receive the on-load voltage and generate the feedback voltage according to the on-load voltage.

6. The low dropout regulator according to claim 1, further comprising:
a noise filter circuit, coupled to the reference voltage source and the error amplifier, and configured to perform noise filtering on the reference voltage provided by the reference voltage source, and send, to the error amplifier, the reference voltage on which noise filtering is performed.

7. A phase-locked loop, comprising:
a low dropout regulator, wherein the low dropout regulator comprises:
a reference voltage source, configured to provide a reference voltage;
an error amplifier, coupled to the reference voltage source, and configured to receive a feedback voltage and the reference voltage, compare the feedback voltage with the reference voltage, and output a control voltage according to a result of comparing the feedback voltage with the reference voltage;
a regulating circuit, coupled to the error amplifier, and configured to receive the control voltage, and output a regulating current under control of the control voltage;
a load, coupled to the regulating circuit and the error amplifier, wherein an on-load voltage is formed when the regulating current passes through the load, and the feedback voltage is related to the on-load voltage;
a first compensation circuit, coupled to the regulating circuit, and configured to regulate a dominant pole and a secondary dominant pole of the low dropout regulator, so as to regulate a phase margin; and
a second compensation circuit, coupled to the first compensation circuit, and configured to: decrease the dominant pole of the low dropout regulator and further increase the secondary dominant pole on the basis that the first compensation circuit has regulated the dominant pole and the secondary dominant pole of the low dropout regulator, so as to regulate the phase margin; and regulate a gain-bandwidth product of the low dropout regulator, wherein:
the second compensation circuit comprises a compensation resistor, wherein a terminal of the compensation resistor is connected to an output terminal of the error amplifier, and another terminal of the compensation resistor is connected to a terminal of a nulling resistor and a gate of the transistor.

8. The phase-locked loop according to claim 7, wherein the regulating circuit comprises a transistor.

9. The phase-locked loop according to claim 8, wherein:
the first compensation circuit comprises the nulling resistor and a Miller compensation capacitor, wherein a terminal of the Miller compensation capacitor is connected to a drain of the transistor, another terminal of the Miller compensation capacitor is connected to a terminal of the nulling resistor, and another terminal of the nulling resistor is connected to the second compensation circuit.

10. The phase-locked loop according to claim 7, wherein a resistance value of the compensation resistor is not less than a resistance value of an equivalent load resistor of the error amplifier and is less than or equal to $R_{B\text{-}MAX}$, wherein $R_{B\text{-}MAX}$ is a resistance value of the compensation resistor when noise reduced by the compensation resistor is equal to noise introduced by the compensation resistor, and the noise reduced by the compensation resistor is noise that is introduced by another component in the low dropout regulator and that is eliminated by the compensation resistor.

11. The phase-locked loop according to claim 7, wherein the low dropout regulator further comprising a feedback circuit, wherein
the feedback circuit is connected to the error amplifier and the load, and is configured to receive the on-load voltage and generate the feedback voltage according to the on-load voltage.

12. The phase-locked loop according to claim 7, wherein the low dropout regulator further comprising:
a noise filter circuit, coupled to the reference voltage source and the error amplifier, and configured to perform noise filtering on the reference voltage provided by the reference voltage source, and send, to the error amplifier, the reference voltage on which noise filtering is performed.

13. A method for improving stability of a low dropout regulator, comprising:
receiving a reference voltage and a feedback voltage;
comparing the feedback voltage with the reference voltage, and generating a control voltage according to a result of comparing the feedback voltage with the reference voltage;
generating a regulating current under control of the control voltage;
regulating the dominant pole and the secondary dominant pole of the low dropout regulator according to the regulating current on the basis that the dominant pole and the secondary dominant pole of the low dropout regulator are regulated according to the regulating current, and regulating a gain-bandwidth product of the low dropout regulator according to the regulating current;
decreasing, by a compensation circuit comprising a compensation resistor, the dominant pole of the low dropout regulator and further increasing the secondary dominant pole, so as to regulate the phase margin; and regulate a gain-bandwidth product of the low dropout regulator, wherein a terminal of the compensation resistor is connected to an output terminal of an error amplifier, and another terminal of the compensation resistor is connected to a terminal of a nulling resistor and a gate of a transistor; and
reducing noise introduced into the low dropout regulator.

14. The method according to claim 13, after the receiving a reference voltage and a feedback voltage, further comprising:

performing noise filtering on the reference voltage; and
the comparing the feedback voltage with the reference voltage comprises: comparing the feedback voltage with the reference voltage on which noise filtering is performed.

* * * * *